US006998626B1

(12) United States Patent
Ryding et al.

(10) Patent No.: US 6,998,626 B1
(45) Date of Patent: Feb. 14, 2006

(54) METHOD OF PRODUCING A DOPANT GAS SPECIES

(75) Inventors: Geoffrey Ryding, Manchester, MA (US); Shu Satoh, Byfield, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/015,740

(22) Filed: Dec. 20, 2004

(51) Int. Cl.
*H01J 37/317* (2006.01)
*H01J 49/10* (2006.01)

(52) U.S. Cl. .......................... 250/492.21; 250/423 R; 250/424; 250/425; 250/426; 315/111.81; 315/111.01; 315/231.41

(58) Field of Classification Search ............ 250/492.21
See application file for complete search history.

(56) References Cited

U.S. PATENT DOCUMENTS

| 4,818,326 A | * | 4/1989 | Liu et al. ................ 156/345.36 |
| 6,540,819 B2 | * | 4/2003 | Tom et al. ..................... 96/108 |

\* cited by examiner

*Primary Examiner*—Nikita Wells
(74) *Attorney, Agent, or Firm*—Boult Wade Tennant

(57) ABSTRACT

This invention relates to a method of producing a dopant gas species containing a required dopant element for implanting in a target and to an ion source for implementing such a method. In particular, although not exclusively, this invention relates to producing dopant ions for implanting in semiconductor wafers using an ion implanter. The present invention provides a method of producing a dopant gas species containing a required dopant element for implanting in a target, the method comprising: exposing a source mass of the element to gaseous bromine and element react to form a reactant product, and ionising the reactant product to produce ions of the dopant gas species.

25 Claims, 3 Drawing Sheets

METHOD OF PRODUCING A DOPANT GAS SPECIES

FIELD OF THE INVENTION

This invention relates to a method of producing a dopant gas species containing a desired dopant element for implanting in a target and to an ion source for implementing such a method. In particular, although not exclusively, this invention relates to producing dopant ions for implanting in semiconductor wafers using an ion implanter.

BACKGROUND OF THE INVENTION

The semiconductor industry has a requirement for the production of semiconductor devices that is most often met by fabrication of arrays of many devices on a single wafer. The semiconductor devices often require doping to very fine tolerances to achieve desired characteristics. Such doping may be performed using an ion implanter that comprises an ion source to generate ions corresponding to, or containing, the required dopant. Optics then form the ions into a focussed ion beam that is incident upon the wafer. Control of the ion beam (e.g. beam current, ion content, energy, size, scanning, etc.) is of paramount importance as this determines the dopant concentration in the wafer and also the depth of implant, thereby determining the conductive properties of the devices.

Typical dopants include boron, phosphorus, arsenic, aluminium, antimony and indium. Ions of these dopants are often produced in the ion source by obtaining a gas containing the required dopant, allowing the gas to enter an arc chamber where an arc discharge ionises the gas to form a plasma. An extraction electrode is used to extract ions from the arc chamber through an aperture provided therein. Further electrodes are used to form an ion beam that is directed at the wafer to be implanted. Generally, the ion beam passes through a mass-analysing magnet that selects only ions with the desired mass/charge ratio: put another way, the mass-analysing magnet effectively rejects unwanted ions that are inevitably produced in the arc chamber/plasma or otherwise generated.

The gas supplied to the arc chamber may be obtained in a variety of ways. One method is to heat the elemental form of the dopant (invariably a solid) in an oven. The vapour so produced is allowed to pass into the arc chamber. However, many of the dopants are metals with low vapour pressures meaning the oven must be operated at high temperatures to produce the required vapour.

Alternatively, compounds containing the dopant of interest may be heated in an oven. U.S. Pat. No. 2002/0029746 discloses heating indium fluoride to achieve indium doping. Adjusting the beam current requires an adjustment of the temperature of the oven and control is therefore limited by the thermal response time of the oven (as much as 30 minutes). Moreover, control is unpredictable because the true temperature of the contents of the oven cannot be known precisely. The low vapour pressure of indium fluoride poses another problem in the condensation of the vapour so produced. Thus, transport of the vapour becomes difficult.

These methods of producing a dopant gas species pose a problem because they show great sensitivity to variations in temperature, i.e. a graph showing how their vapour pressure varies with temperature is particularly steep around the operating temperature of the ovens. As a result, there is a burden in that fine control of the oven temperature is necessary. Typically, the oven must be controlled to better than 1° C.

Another approach to producing the required dopant in gaseous form is to pass a gas over the dopant (or a compound thereof) such that the two react to form the required gas that drifts into the arc chamber. This technique has been known for quite some time, both in ion implantation and in other fields. For example, Sidenius and Stilbreid in E.M. Separations with High Efficiency of Microgramme Qualities (E.M. Separation of Radioactive Isotopes, Proceedings of the International Symposium, Vienna, May 1960, Springer-Verlag, pp 244–249) discloses passing carbon tetrachloride over heated rare-earth oxides to form gaseous chlorides of the rare earth. Halides such as carbon tetrachloride are often used because of their high vapour pressure. More recently, U.S. Pat. No. 6,001,172 discloses passing a variety of gases such as fluorides ($NF_3$, $ClF_3$, $BF_3$ and fluorine itself) over heated indium or antimony to produce fluorides of indium or antimony that are then ionised.

SUMMARY OF THE INVENTION

It is an object of the present invention to improve on the methods of producing dopant gas species described above.

From a first aspect, the present invention resides in a method of producing a dopant gas species containing a desired dopant element for implanting in a target, the method comprising: exposing a source mass of the element to gaseous bromine such that the bromine and element react to form a reactant product, and ionising the reactant product to produce ions of the dopant gas species.

Use of a bromine gas to create volatile bromide, rather than using chlorides and fluorides previously suggested, has been found to have many benefits, as follows.

(1) Bromine reactions have been found to have a much reduced temperature sensitivity than other halides thereby removing the onerous requirement for tight temperature control of the oven. Instead, the temperature of the oven can be allowed to drift around a desired temperature without the amount of bromine production changing appreciably. The flow of bromine vapour may then be adjusted to control an ion beam flux, for example.

(2) When used with indium as the source element, bromine is beneficial as indium bromide has an acceptably high vapour pressure at temperatures as low as around 400° C. This lower oven temperature results in a less reactive environment. Use of fluorine instead requires substantial heating of the indium as indium fluoride requires temperatures in excess of 800° C. for a sufficient amount of vapour to be liberated.

(3) Bromine is less reactive than fluorine making it easier to handle with less safety precautions to consider. Also, its higher vapour pressure means less condensation. Thus transporting the bromine vapour from bottle to reaction chamber is easier.

(4) Bromine is a liquid at room temperature with a high vapour pressure that allows vapour released by the liquid to be passed along ordinary gas handling systems (by gaseous bromine, we mean pure gas vapours, mists, atomised suspensions, etc. that are essentially gas like and so can be handled like a gas).

(5) Bromine is relatively inexpensive to buy.

(6) Unlike carbon tetrachloride, the use of bromine does not result in carbon deposits being left in the source.

(7) Bromine has two isotopes at 79 and 81 amu, both separated from other popular elements used in the semiconductor industry. Indium has isotopes at 113 and 115 amu producing double-charge ions at 56.5 and 57.5 amu, and antimony has isotopes at 129 and 131 amu producing double-charge ions at 64.5 and 65.6 amu. This separation ensures that any bromine ions extracted from the ionisation chamber will be rejected by the mass-analysing magnet.

Preferably, the method further comprises regulating the supply of gaseous bromine to the element. This, in turn, leads to a regulation of the rate of ion production in the ionisation chamber and hence the ion beam current. Moreover, this method of control is far more responsive than the prior art method of varying the temperature of an oven.

In fact, only the flow rate may be regulated to control ion beam current and the oven temperature need not be altered. For example, there is a delay between turning off an oven and ion production coming to a stop corresponding to the time the oven takes to cool. Clearly, interrupting the supply of the bromine gas may be effected rapidly such that cessation of ion production follows very quickly.

Optionally, the supply of gaseous bromine is regulated such that a reservoir of reactant product does not build up in the ionisation chamber. This "starved" mode of operation ensures the reactant product has a very short mean lifetime in the ionisation chamber prior to being ionised and extracted. Having a reservoir of reactant in the ionisation chamber is less desirable because the response time following adjustment of the flow rate of the bromine gas is degraded. The flow of gaseous bromine may be regulated by a flow control device; i.e. a mass flow controller or a valve.

From a second aspect, the present invention resides in a method of producing ions from a source material in an ion implanter comprising an ion source having an ionisation chamber and an oven supplied with a regulated gas supply, the method comprising providing a mass of the source metal in the oven, connecting a container containing liquid bromine to the gas supply, regulating the flow of bromine vapour produced by the liquid bromine along the gas supply, exposing the source material to the regulated supply of bromine vapour thereby to react to produce a gaseous reactant product, the gaseous reactant product being free to pass into the ionisation chamber, and operating an arc discharge in the ionisation chamber thereby to ionise the reactant product and produce the ions.

From a third aspect, the present invention resides in a method of implanting a semiconductor wafer including any of the methods of producing a dopant gas species described above.

From a fourth aspect, the present invention resides in an ion source comprising: a vessel containing liquid bromine, means defining a path from the vessel through an ionisation chamber to an exit aperture of the ionisation chamber, along which path bromine vapour produced by the liquid bromine may pass, a mass of source material positioned in the path and electrodes operable to provide an arc discharge within the ionisation chamber.

The means defining a path may be a conduit such as a pipe or the like.

Preferably, the ion source further comprises a regulator disposed along the path operable to regulate the flow of bromine vapour along the path. Optionally, the regulator is located upstream of the mass of source material although, alternatively, the regulator may be located between the mass of source material and the ionisation chamber.

Optionally, the ion source further comprises a controller operable to receive an input indicative that the ion source should be shut down and to effect shutting down of the ion source by closing the regulator. The controller may be a dedicated device, or it may be shared with other components of an ion implanter in which it may be located.

The input may come from a variety of sources. For example, the input may be derived from a manual shutdown, say following an operator pushing an "off" button or effecting shutdown using a computer-controlled graphical user interface. The input may also be generated automatically, possibly at the end of a pre-programmed procedure or as the result of a fault being detected automatically.

In addition merely to effecting shutdown of the ion source, the controller may also regulate flow of gaseous bromine. This may be performed in response to the controller determining the flow rate of bromine vapour.

From a fifth aspect, the present invention resides in an ion implanter comprising the ion source described above, means for extracting ions through the exit aperture of the ionisation chamber and means for guiding the extracted ions along an ion beam path to be incident upon a target to be implanted.

The means for extracting ions may be a structural element containing an electric charge to attract or repel ions out of the ionisation chamber, e.g. an electrode supplied with an appropriate voltage. Alternatively, the means for extracting ions may be a magnet operable to produce a magnetic field to cause ions to exit the ionisation chamber.

The means for guiding the extracted ions may comprise ion optics such as electrodes supplied with appropriate voltages or other charged structural members, or such as magnets operable to produce suitable focussing magnetic fields.

Optionally, the ion implanter operates using a feedback loop such that the flow of bromine vapour is regulated to achieve a desired ion beam current. One possible implementation is for the ion implanter further to comprise a monitor for monitoring the ion beam as it traverses the ion beam path and a controller operable to receive a signal from the monitor that is indicative of the ion beam current. The controller may determine whether the current corresponds to a desired current and, if not, to adjust the regulator to achieve the desired current.

Other preferred, but optional, features of the above method and apparatus are set out in the appended claims.

BRIEF DESCRIPTION OF THE DRAWINGS

In order that the invention can be more readily understood, reference will now be made, by way of example only, to the accompanying drawings, in which.

DETAILED DESCRIPTION OF THE INVENTION

Figure 1:
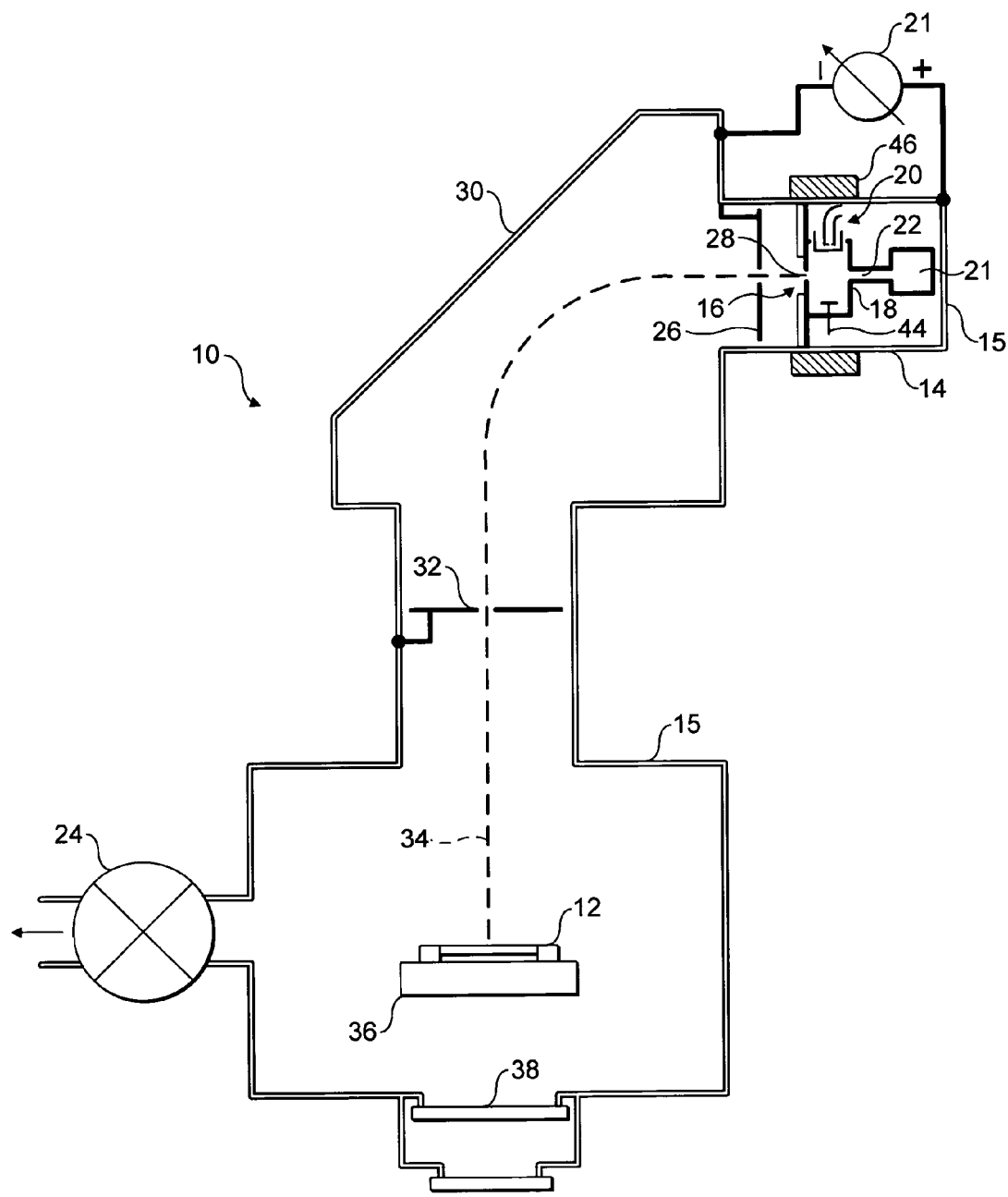
FIG. 1 is a schematic view of an ion implanter according to an embodiment of the present invention.

An ion implanter 10 for implanting ions in semiconductor wafers 12 is shown in FIG. 1 that includes an ion source 14 according to the present invention. Ions are generated by the ion source 14 to be extracted and passed through a mass analysis stage 30. Ions of a desired mass to charge ratio selected to pass through a mass-resolving slit 32 and then to strike a semiconductor wafer 12.

The ion implanter 10 contains an ion source 14 for generating an ion beam of a desired species that is located within a vacuum chamber 15. The ion source 14 generally comprises an arc (or discharge or ionisation) chamber 16 containing a cathode 20 located at one end thereof and an anode that is provided by the walls 18 of the arc chamber 16. The cathode 20 is heated sufficiently to generate thermal electrons.

Thermal electrons emitted by the cathode 20 are attracted to the anode, i.e. the adjacent chamber walls 18. The thermal electrons ionise gas molecules as they traverse the arc chamber 16, thereby forming a plasma and generating the desired ions. The gas molecules are produced in an oven 21 and drift into the arc chamber 16 through gas feed 22.

The path followed by the thermal electrons is controlled to prevent the electrons merely following the shortest path to the chamber walls 18. A magnet assembly 46 provides a magnetic field extending through the arc chamber 16 such that thermal electrons follow a spiral path along the length of the arc chamber 16 towards a counter-cathode 44 located at the opposite end of the arc chamber 16.

A gas feed 22 fills the arc chamber 16 with a precursor gas species. The thermal electrons travelling through the arc chamber 16 ionise the precursor gas molecules and possibly also crack the precursor gas molecules as well to form other ions. The ions created in the plasma will also contain trace amounts of contaminant ions (e.g. generated from the material of the chamber walls).

Ions from within the arc chamber 16 are extracted through an exit aperture 28 using a negatively-biased extraction electrode 26. A potential difference is applied between the ion source 14 and the following mass analysis stage 30 by a power supply 21 to accelerate extracted ions, the ion source 14 and mass analysis stage 30 being electrically isolated from each other by an insulator (not shown). The mixture of extracted ions are then passed through the mass analysis stage 30 so that they pass around a curved path under the influence of a magnetic field. The radius of curvature travelled by any ion is determined by its mass, charge state and energy. The magnetic field is controlled so that, for a set beam energy, only those ions with a desired mass and charge state exit along a path coincident with the mass-resolving slit 32. The emergent ion beam 34 is then transported to the target, i.e. one or more semiconductor wafers 12 to be implanted or a beam stop 38 when there is no wafer 12 in the target position. In other modes, the beam 34 may also be decelerated using a lens assembly positioned between the mass analysis stage 30 and the target position.

Figure 2:
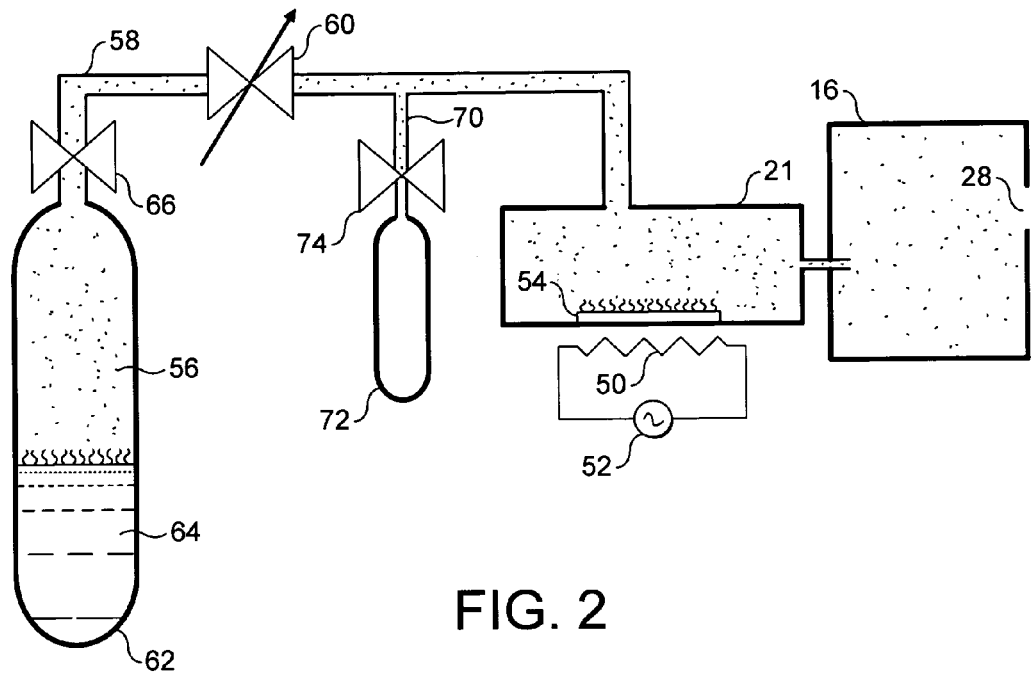
FIG. 2 is a simplified view of an ion source according to an embodiment of the present invention.

An ion source 14 suitable for use in the ion implanter 10 of FIG. 1 is shown in a simplified schematic form in FIG. 2. The ion source 14 includes an arc chamber 16 connected to an oven 21 by gas supply 22. The oven 21 is heated by a heating element 50 supplied with current from a current source 52 (that may be either a dc or ac source). The heating element 50 is located adjacent the oven 21 which contains the source material reactant 54. In this case, the reactant 54 is a strip of indium, although other metals such as antimony or other source materials may be used, whether in strip-form or otherwise (e.g. powdered).

Bromine vapour 56 is introduced into the oven 21 by gas feed 58 that includes an adjustable regulator 60 such as a mass flow controller. A bottle 62 of liquid bromine 64 is connected to another end of the gas feed 58 through a valve 66.

A second line 70 is provided to merge with gas feed 58. This line 70 is connected to an argon gas supply 72 via valve 74. The argon gas supply 72 allows the ion source 14 to be purged with argon (or with any other suitable inert gas). This gas may also be used to maintain an arc within the arc chamber 16 when the bromine supply 56 is inhibited.

Thus, the ion source 14 operates as follows. Bottle 62 contains liquid bromine 64 as well as bromine vapour 56 due to its high vapour pressure. Valve 66 is left open so that bromine vapour 56 passes along gas feed 58 to regulator 60. The regulator 60 is set to allow only a desired flow of bromine vapour 56 onwards to the oven 21.

The bromine vapour 56 drifts into oven 21, where it may contact the indium 54 and react to form gaseous indium bromide 68. The oven 21 is operated to maintain a temperature of around 380° C. As mentioned previously, the present invention advantageously does not require careful control of the temperature of the oven 21. This is because the bromine/indium reaction does not show great sensitivity to temperature and so the temperature of the oven 21 may drift without the flow rate of indium bromine 68 into the arc chamber 16 being adversely affected.

Gas from the oven 21, including both bromine vapour 56 and gaseous indium bromide 68, drifts along gas supply 22 into arc chamber 16 where it may be ionised before subsequent extraction through aperture 28. The cathode 20 and counter-cathode 44 are not shown in the arc chamber 16 of FIG. 2 for the sake of clarity.

The regulator 60 is set to allow a flow of bromine vapour 56 such that only enough indium bromide 68 collects in the arc chamber 16 to meet the required indium ion beam current (a "bromine starved" mode of operation). Put another way, the arc chamber 16 is not flooded to create a reservoir of indium bromide/indium ions ready for extraction. Operation of the regulator 60 to obtain the correct rate of flow can be found empirically or may be performed automatically using a negative feedback loop from an ion beam current monitor or the like.

Figure 3:
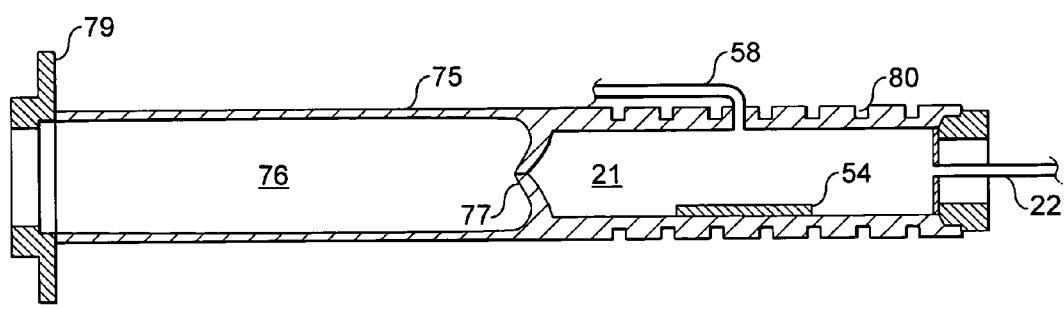
FIG. 3 is a side sectional view of an oven according to an embodiment of the present invention.

FIG. 3 shows in greater detail an example of an oven 21 having a body 75 of generally cylindrical shape. The oven 21 is mounted to the arc chamber 16 via a flange 79 such that the gas supply 22 projects into the arc chamber 16. The body 75 is hollow with a central wall 77 that partly defines the oven 21. The body 75 also defines a stand-off chamber 76.

Oven 21 contains the strip of indium 54 and has an inlet corresponding to the gas feed 58. The gas feed 58 enters the oven 21 opposite the indium 54 so that bromine vapour 56 passes over the indium 54 after exiting the gas feed 58. A spiral groove 80 is provided in the unitary body around the oven 21 that receives the heating element 50 (not shown in FIG. 3 for the sake of clarity). Thus, the heating element 50 heats the oven 21 when a current is passed therethrough.

EXAMPLE

Figure 4:
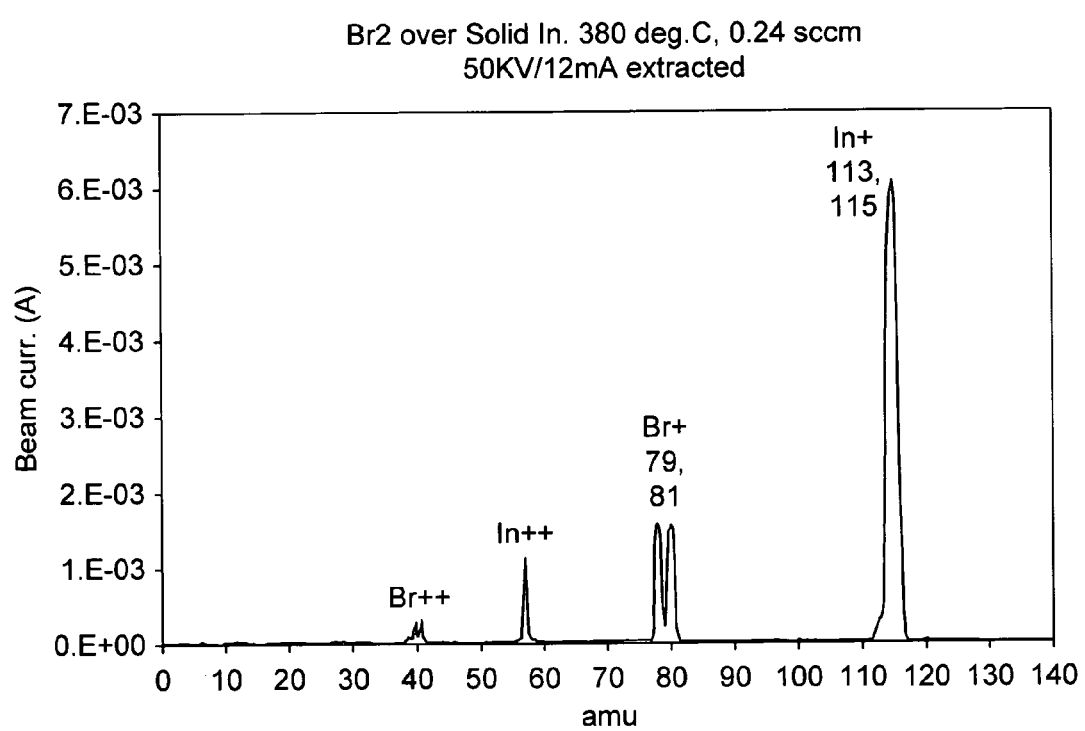
FIG. 4 is a mass spectrum of the ions produced according to an embodiment of the present invention.

By way of example, FIG. 4 shows the results of an experiment conducted using an ion source 14 exemplified by FIGS. 2 and 3. In the experiment, 100 g of bromine liquid 64 was placed in a stainless steel container 62. The flow of bromine vapour 56 was regulated at 0.24 sccm, which has been found to optimise the production of $In^{++}$ ions.

The oven 21 contained 8 g of indium metal strip 54 and was heated to 380° C. The arc chamber 16 was operated to arc at 75V/1A. An extraction current of 12 mA was used with an extraction voltage of 50 kV. This extraction voltage is generally low, but allowed the observation of $In^+$ ions. These conditions produced an $In^{++}$ beam current of 1 mA, as shown in FIG. 4 that shows the beam currents of the different ions extracted from the arc chamber 16. During implantation, the bromine ions and undesired indium ions may be rejected using the mass analysing magnet 30.

In addition, the effect of varying the oven temperature on a 1 mA In$^{++}$ beam was investigated. An initial temperature of 400° C. was stepped down to 380° C., 360° C. and then 340° C. before being stepped back up to 400° C. and beyond to 420° C., 440° C. and 460° C. Only at 340° C. was the ion beam current observed to change (it decreased): at all other temperatures the ion beam current remained steady thus showing the process to be insensitive to temperature over a wide range. As noted before, this is particularly beneficial as it removes the requirement for a high degree of control over the oven temperature.

Finally, the response times following operation of the regulator 60 to switch off, then switch on the bromine vapour 56 flow was tested. The regulator 60 was shut rapidly and the In$^{++}$ beam was seen to extinguish in less than 30 seconds. After closing the regulator 60, the argon supply 70 was turned on to purge the ion source 14 and keep the arc going. The argon was then switched off and the regulator 60 turned back on rapidly. The In$^{++}$ beam was seen to re-establish within 30 seconds.

Those skilled in the art will appreciate that variations may be made to the above embodiments without departing from the scope of the present invention. For example, the oven 21 of FIG. 3 is but merely one design that may be used. The length of the gas supply 22 of FIG. 3 is advantageously short to achieve quicker response times when the regulator 60 is adjusted.

While it is convenient merely to use liquid bromine 64 from which bromine vapour 56 is collected, other arrangements are possible. For example, the liquid bromine 64 may be warmed or a supply of gaseous bromine derived from any other source may be provided.

Of course, how the indium 54 or other source material is heated is immaterial. In fact, heating can be omitted altogether although this will result in reduced ion beam currents.

The foregoing embodiments show the source material reactant 54 to be located in an oven 21 that is separate from the arc chamber 16: this need not be the case. The reactant 54 need not be located in an oven 21 when heating is not required and, irrespective of that consideration, the reactant 54 may be located within the arc chamber 16 itself. In this latter arrangement the gas feed 58 and line 70 used to provide bromine vapour 56 and argon respectively in the foregoing embodiments may be connected directly to the arc chamber 16.

What is claimed is:

1. A method of producing a dopant gas species containing a required dopant element for implanting in a target, the method comprising: exposing a source mass of the element to gaseous bromine such that the bromine and element react to form a reactant product, and ionising the reactant product to produce ions of the dopant gas species.

2. The method of claim 1, further comprising regulating the supply of gaseous bromine to the element.

3. The method of claim 2, further comprising controlling the rate of production of ions by regulating the supply of gaseous bromine.

4. The method of claim 2, comprising regulating the supply of gaseous bromine to the ionisation chamber to operate in a starved mode such that the flow of bromine is regulated to be insufficient to build up a reservoir of reactant product in the ionisation chamber.

5. The method of claim 2, wherein the element is located in a reaction chamber separate from the ionisation chamber and the method further comprises regulating admittance of the gaseous bromine into the reaction chamber by operating a flow control device.

6. The method of claim 5, wherein operating the flow control device comprises operating a mass flow controller or a valve.

7. The method of claim 1, further comprising providing a local source of liquid bromine and wherein exposing the source mass of the element to gaseous bromine comprises exposing the element to bromine vapour produced by the liquid bromine.

8. The method of claim 1, comprising exposing a source mass of a metal to the gaseous bromine.

9. The method of claim 8, comprising exposing a source mass of indium or antimony to gaseous bromine.

10. The method of claim 1, further comprising heating the source mass of the element.

11. The method of claim 1, wherein control of the rate of production of ions does not comprise varying the temperature of the oven.

12. The method of claim 1, comprising heating the element in an oven separate from the ionisation chamber and allowing the reactant product to pass along a conduit connecting the oven and the ionisation chamber.

13. A method of producing ions from a source material in an ion implanter comprising an ion source having an ionisation chamber and an oven supplied with a regulated gas supply, the method comprising providing a mass of the source material in the oven, connecting a container containing liquid bromine to the gas supply, regulating the flow of bromine vapour produced by the liquid bromine along the gas supply, exposing the source material to the regulated flow of bromine vapour thereby to react to produce a gaseous reactant product, the gaseous reactant product being free to pass into the ionisation chamber, and operating an arc discharge in the ionisation chamber thereby to ionise the reactant product and produce the ions.

14. A method of implanting a semiconductor wafer comprising guiding ions produced in accordance with claim 13 to be incident on the wafer.

15. An ion source comprising: a vessel containing liquid bromine; means defining a path from the vessel through an ionisation chamber to an exit aperture of the ionisation chamber, along which path bromine vapour produced by the liquid bromine may pass; a mass of source material positioned in the path; and electrodes operable to provide an arc discharge within the ionisation chamber.

16. The ion source of claim 15, further comprising a regulator disposed along the path operable to regulate the flow of bromine vapour along the path.

17. The ion source of claim 16, wherein the regulator is located upstream of the mass of source material.

18. The ion source of claim 16, wherein the regulator is a mass flow controller or a valve.

19. The ion source of claim 15, wherein the mass of source material is located in an oven, the path passing through the oven.

20. The ion source of claim 15, wherein the mass of source material comprises a metal.

21. The ion source of claim 20, wherein the metal comprises indium or antimony.

22. The ion source of claim 15, further including a controller operable to receive an input indicative that the ion source should be shut down and to effect shutting down of the ion source by closing the regulator.

23. The ion source of claim 22, wherein the controller is further operable to determine the flow rate of bromine vapour into the ionisation chamber and to operate the regulator accordingly.

24. An ion implanter comprising the ion source of claim 15, means for extracting ions through the exit aperture of the ionisation chamber and for guiding the extracted ions along an ion beam path to be incident upon a target to be implanted.

25. The ion implanter of claim 24, further comprising a monitor for monitoring the ion beam as it traverses the ion beam path and a controller operable to receive a signal from the monitor that is indicative of the ion beam current and to determine whether the current corresponds to a desired current and, if not, to adjust the regulator to achieve the desired current.

* * * * *